US012621966B2

(12) United States Patent
Abdul Gafar et al.

(10) Patent No.: US 12,621,966 B2
(45) Date of Patent: May 5, 2026

(54) HEAT DISSIPATION STRUCTURE AND VEHICLE CHARGING DEVICE

(71) Applicant: Lite-On Singapore Pte Ltd, Singapore (SG)

(72) Inventors: Muhammad Azhar Abdul Gafar, Singapore (SG); Peng Gao, Singapore (SG)

(73) Assignee: Lite-On Singapore Pte Ltd, Singapore (SG)

( * ) Notice: Subject to any disclaimer, the term of this patent is extended or adjusted under 35 U.S.C. 154(b) by 243 days.

(21) Appl. No.: 18/418,317

(22) Filed: Jan. 21, 2024

(65) Prior Publication Data

US 2025/0071955 A1 Feb. 27, 2025

(30) Foreign Application Priority Data

Aug. 25, 2023 (CN) .......................... 202311081802.5

(51) Int. Cl.
*H05K 7/20* (2006.01)
*B60L 53/302* (2019.01)

(52) U.S. Cl.
CPC ........ *H05K 7/20872* (2013.01); *B60L 53/302* (2019.02); *H05K 7/20254* (2013.01); *H05K 7/20927* (2013.01)

(58) Field of Classification Search
CPC ........... H05K 7/20872; H05K 7/20927; H05K 7/20254; B60L 53/302; H02J 7/00309
See application file for complete search history.

(56) References Cited

U.S. PATENT DOCUMENTS

| | | | | |
|---|---|---|---|---|
| 9,362,040 B2 * | 6/2016 | Rai | .................... | H05K 7/20854 |
| 9,622,377 B2 * | 4/2017 | Rai | .................... | H05K 7/20927 |
| 10,568,235 B2 * | 2/2020 | Liu | .................... | H05K 7/1427 |
| 10,696,184 B2 * | 6/2020 | Tang | .................. | H05K 7/20927 |
| 11,785,740 B2 * | 10/2023 | Brar | .................. | H05K 7/20254 |
| | | | | 361/699 |
| 2006/0002090 A1 * | 1/2006 | Liao | ..................... | H01L 23/427 |
| | | | | 361/710 |

(Continued)

FOREIGN PATENT DOCUMENTS

| | | | | |
|---|---|---|---|---|
| CN | 111107734 A | * | 5/2020 | ............ B60L 53/302 |
| CN | 212022363 U | * | 11/2020 | |
| CN | 213280454 U | * | 5/2021 | |

(Continued)

*Primary Examiner* — Zachary Pape
(74) *Attorney, Agent, or Firm* — JCIPRNET

(57) ABSTRACT

A heat dissipation structure, for cooling a vehicle charging device, is provided and includes a cover body, a housing and a flow channel structure. The housing includes a bottom wall, an inlet end and an outlet end. The cover body is hermetically sealed to the bottom wall of the housing. The inlet end and the outlet end are respectively disposed on at least one sidewall of the housing. The flow channel structure is disposed in the housing and includes a first channel and at least one second channel communicating with each other. The inlet end communicates with the first channel. The outlet end communicates with the at least one second channel. The first channel is formed between the bottom wall of the housing and the cover body, and the at least one second channel rises from the first channel. A vehicle charging device is also provided.

20 Claims, 7 Drawing Sheets

(56)                    References Cited

U.S. PATENT DOCUMENTS

| | | | | | |
|---|---|---|---|---|---|
| 2021/0098333 | A1 * | 4/2021 | Ku | ........................ | H01L 23/473 |
| 2023/0200029 | A1 * | 6/2023 | Wu | ........................ | H01F 27/06 |
| | | | | | 361/699 |

FOREIGN PATENT DOCUMENTS

| | | | | | |
|---|---|---|---|---|---|
| CN | 213585212 | | 6/2021 | | |
| CN | 113645812 | A * | 11/2021 | ........... | H05K 1/0201 |
| CN | 215221480 | U * | 12/2021 | | |
| CN | 215345567 | U * | 12/2021 | | |
| CN | 215819181 | U * | 2/2022 | | |
| CN | 217361718 | U * | 9/2022 | .......... | H01M 10/667 |
| EP | 3749075 | A1 * | 12/2020 | ......... | H05K 7/20327 |
| KR | 20200027728 | A * | 3/2020 | ........... | H05K 5/0026 |

* cited by examiner

HEAT DISSIPATION STRUCTURE AND VEHICLE CHARGING DEVICE

CROSS-REFERENCE TO RELATED APPLICATION

This application claims the priority benefit of China application serial no. 202311081802.5, filed on Aug. 25, 2023. The entirety of the above-mentioned patent application is hereby incorporated by reference herein and made a part of this specification.

BACKGROUND

Technical Field

The invention relates to a heat dissipation structure and a charging device, and in particular to a liquid-cooling heat dissipation structure and a vehicle charging device.

Description of Related Art

On-board chargers (OBC) with high power density have become a trend in the automotive electronics market. High-power electronic devices such as DC or AC on-board chargers have complex circuits and structures, so their heat dissipation is demanding; thus, how to enhance the performance of heat dissipation for such devices has become a major challenge. In more detail, a heat source in an on-board charger is generally disposed on a horizontal board or a vertical board to achieve a compact design and high power density. Heat dissipation in such design is demanding and thus requires highly efficient approaches for heat dissipation. One of the most efficient approaches for heat dissipation is liquid cooling.

In most of the current liquid-cooling heat dissipation designs, the heat source is usually mounted on a single cooling plate, and the heat generated by the heat source is taken away by a cooling liquid through the two-dimensional cooling channel in the cooling plate to realize heat dissipation. For example, CN 213585212U discloses a high power density on-board charger with a cooling plate. However, the cooling channel in the cooling plate is two-dimensional, with limited heat dissipation performance. Furthermore, the cooling liquid inlet and the cooling liquid outlet of the cooling plate are disposed opposite to each other so that the cooling liquid flows from one side of the housing, completely passes through the region targeted for heat dissipation, and then flows out from the opposite side of the housing. If the cooling liquid inlet and the cooling liquid outlet were disposed on the same side of the housing, the cooling liquid would not be able to completely cover the region targeted for heat dissipation, and in fact, on-board chargers are often required to have the cooling liquid inlet and the cooling liquid outlet disposed on the same side of the on-board charger. Therefore, such design is not suitable for on-board chargers.

As such, developing a liquid-cooling channel design that better dissipates heat of high-power-density electronic devices is a major focus of current research.

SUMMARY

The invention provides a heat dissipation structure, which may provide good heat dissipation and effectively save space.

The invention provides a vehicle charging device, which has the heat dissipation structure.

A heat dissipation structure for cooling a vehicle charging device according to an embodiment of the invention includes a cover body, a housing and a flow channel structure. The housing includes a bottom wall, an inlet end and an outlet end. The cover body is hermetically sealed to the bottom wall of the housing. The inlet end and the outlet end are respectively disposed on at least one sidewall of the housing. The flow channel structure is disposed in the housing and includes a first channel and at least one second channel communicating with each other. The inlet end communicates with the first channel. The outlet end communicates with at least one second channel. The first channel is formed between the bottom wall of the housing and the cover body. The at least one second channel rises from the first channel.

According to an embodiment of the invention, a cooling fluid is adapted to flow into the housing from the inlet end, pass through the first channel and the at least one second channel in sequence, and flow out of the housing from the outlet end.

According to an embodiment of the invention, the housing further includes at least two inner sidewalls opposite to each other. The at least two inner sidewalls are disposed nearly vertically on the bottom wall. The at least one second channel is formed between the at least two inner sidewalls.

According to an embodiment of the invention, the flow channel structure further includes a communicating space. The at least one second channel includes two second channels, the communicating space communicates between the two second channels and the outlet end, and a depth of the communicating space in a direction perpendicular to the bottom wall is greater than a depth of the first channel in the direction.

According to an embodiment of the invention, the heat dissipation structure further includes at least one flow guiding element. The at least one flow guiding element is arc-shaped, disposed on the bottom wall of the housing and located in the first channel.

According to an embodiment of the invention, a gap is formed between the cover body and the at least one flow guiding element.

According to an embodiment of the invention, the heat dissipation structure further includes a plurality of protruding portions. The protruding portions protrude from the bottom wall of the housing and are located in the first channel.

According to an embodiment of the invention, the inlet end and the outlet end are located on a same side of the housing.

According to an embodiment of the invention, a width of the at least one second channel is between 4 mm and 5 mm, and a height of the at least one second channel is between 40 mm and 60 mm.

A vehicle charging device according to an embodiment of the invention includes a heat dissipation structure and at least one heating element. The heat dissipation structure includes a cover body, a housing and a flow channel structure. The housing includes a bottom wall, an inlet end and an outlet end. The cover body is hermetically sealed to the bottom wall of the housing. The inlet end and the outlet end are respectively disposed on at least one sidewall of the housing. The flow channel structure is disposed in the housing and includes a first channel and at least one second channel communicating with each other. The inlet end communicates with the first channel. The outlet end communicates with at least one second channel. The first channel is formed between the bottom wall of the housing and the cover body. The at least one second channel rises from the first channel. The at least one heating element is disposed in the housing. The cooling fluid is adapted to flow through the flow channel structure to dissipate heat from the at least one heating element.

According to an embodiment of the invention, the vehicle charging device further includes an inner sidewall and a board nearly perpendicular to the bottom wall. The at least one heating element is an active electronic component and is configured on the board. The board is connected to the inner sidewall. The inner sidewall is disposed nearly vertically on the bottom wall, and the at least one heating element is thermally coupled to the at least one second channel through the board and the inner sidewall.

According to an embodiment of the invention, the vehicle charging device further includes a board parallel to or nearly perpendicular to the bottom wall. The at least one heating element is a passive electronic component configured on the board. The board is disposed in the housing. The at least one heating element contacts the bottom wall and is thermally coupled to the first channel.

In summary, in the heat dissipation structure of the invention, when the cooling fluid flows into the flow channel structure, the vehicle charging device may be cooled through the first channel and the at least one the second channel. Since the at least one second channel rises from the first channel, the first channel and the at least one second channel are located on different planes, thereby increasing the cooling area without reducing the power density of the vehicle charging device, which is beneficial for product miniaturization. Meanwhile, the heating element may be freely disposed on the first channel or the at least one second channel, making the use of space in the housing more flexible. More importantly, through the combination of the first channel and the at least one second channel which are perpendicular or nearly perpendicular to each other, the invention realizes liquid cooling in a three-dimensional space and thus effectively improves heat dissipation.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
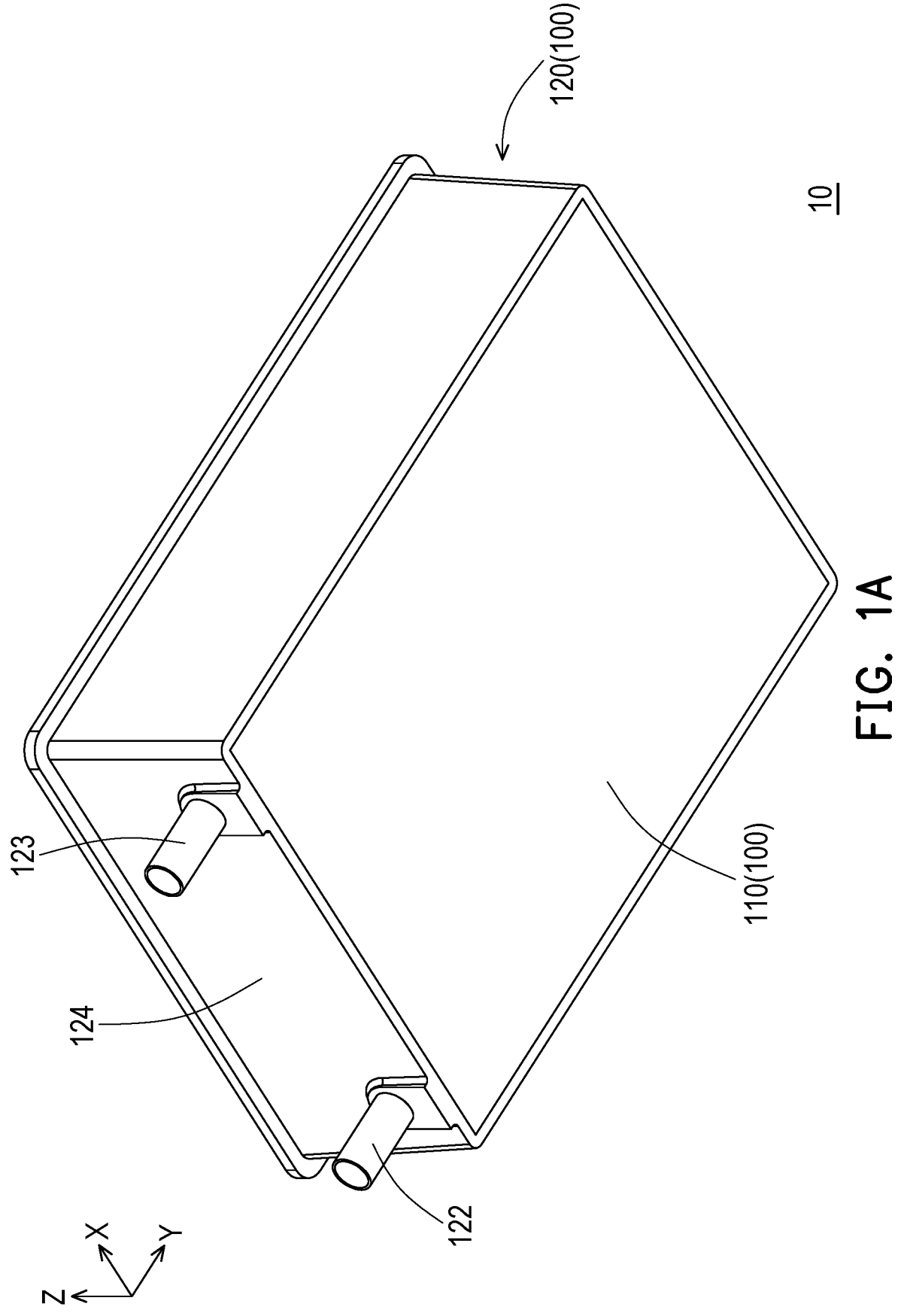
FIG. 1A is a schematic diagram of a vehicle charging device according to an embodiment of the invention.

Reference will now be made in detail to the exemplary embodiments of the invention, examples of which are illustrated in the accompanying drawings. Wherever possible, the same reference numbers are used in the drawings and descriptions to refer to the same or like parts.

Figure 1B:
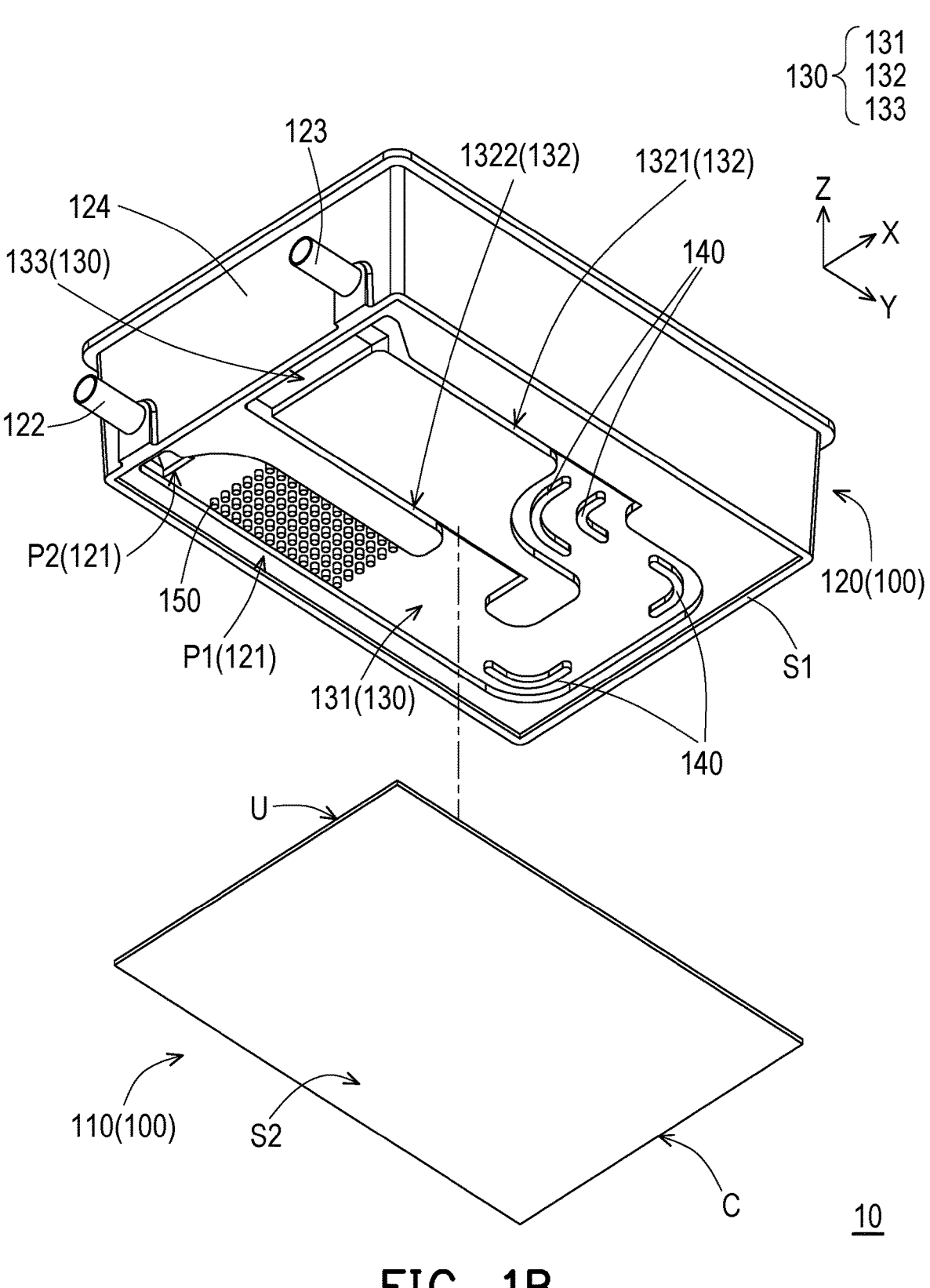
FIG. 1B is an exploded view of the vehicle charging device of FIG. 1A.

FIG. 1A is a schematic diagram of a vehicle charging device according to an embodiment of the invention. FIG. 1B is an exploded view of the vehicle charging device in FIG. 1A. Please refer to FIG. 1A and FIG. 1B, the vehicle charging device 10 in the embodiment is, for example, an on-board charger (OBC) which may charge a battery of a vehicle. The vehicle charging device 10 includes heat dissipation structure 100. A heat dissipation structure 100 may provide liquid cooling for the vehicle charging device 10, so as to prevent the vehicle charging device 10 from being damaged due to overheating.

As shown in FIG. 1B, the heat dissipation structure 100 includes a cover body 110, a housing 120 and a flow channel structure 130. The housing 120 includes a bottom wall 121, at least one sidewall 124, an inlet end 122 and an outlet end 123. The cover body 110 is hermetically sealed to the bottom wall 121 of the housing 120. Specifically, the bottom wall 121 is recessed from a first lower surface S1 of the housing 120 to form a first surface P1, an upper surface U of the cover body 110 is attached to the first surface P1, and a second lower surface S2 of the cover body 110 is flush with the first lower surface S1 of 120, so as to keep the appearance of heat dissipation structure 100 flat. The perimeter C of the cover body 110 is welded to the inner edges of the first lower surface S1 of the housing 120 by means of friction stir welding. The cover body 110 and the housing 120 may be well-sealed together without melting the housing 120 and the cover body 110 and prevent a cooling fluid from seeping out of the perimeter C of the cover body 110 when the heat dissipation structure 100 performs liquid cooling.

The sidewall 124 of the housing 120 is connected to the bottom wall 121, and the inlet end 122 and the outlet end 123 are disposed on the sidewall 124 and connected to the flow channel structure 130. The flow channel structure 130 is disposed in the housing 120 and includes a first channel 131, at least one second channel 132, and a communicating space 133 connecting with the first channel 131 and the second channel 132. The inlet end 122 communicates with the first channel 131, and the communicating space 133 connects the at least one second channel 132 and the outlet end 123. The first channel 131 is formed between the bottom wall 121 of the housing 120 and the cover body 110. Specifically, the bottom wall 121 further includes a second surface P2. The second surface P2 is recessed from the first surface P1, and the first channel 131 is formed between the second surface P2 and the upper surface U of the cover body 110.

The at least one second channel 132 in the embodiment includes two second channels 1321, 1322 parallel to each other, but the number of the at least one second channel 132 is not limited thereto. The second channels 1321, 1322 rise from the first channel 131. The plane where the second channels 1321, 1322 are located is perpendicular or nearly perpendicular to the plane (parallel to the XY plane) where the first channel 131 is located, the angle between the first channel 131 and the second channels 1321, 1322 is between 85 degrees and 95 degrees, for example. Through the design of the second channels 1321, 1322 that are perpendicular or nearly perpendicular to the first channel 131, the heat dissipation of the heat dissipation structure 100 can be expanded from the two-dimensional plane (that is, the plane where the first channel 131 is located) to the three-dimensional space, not only improving the effect of heat dissipation but fully utilizing the space in the housing 120, which is beneficial to product miniaturization. The design of heat dissipation in this embodiment will be explained in more detail below.

Figure 2:
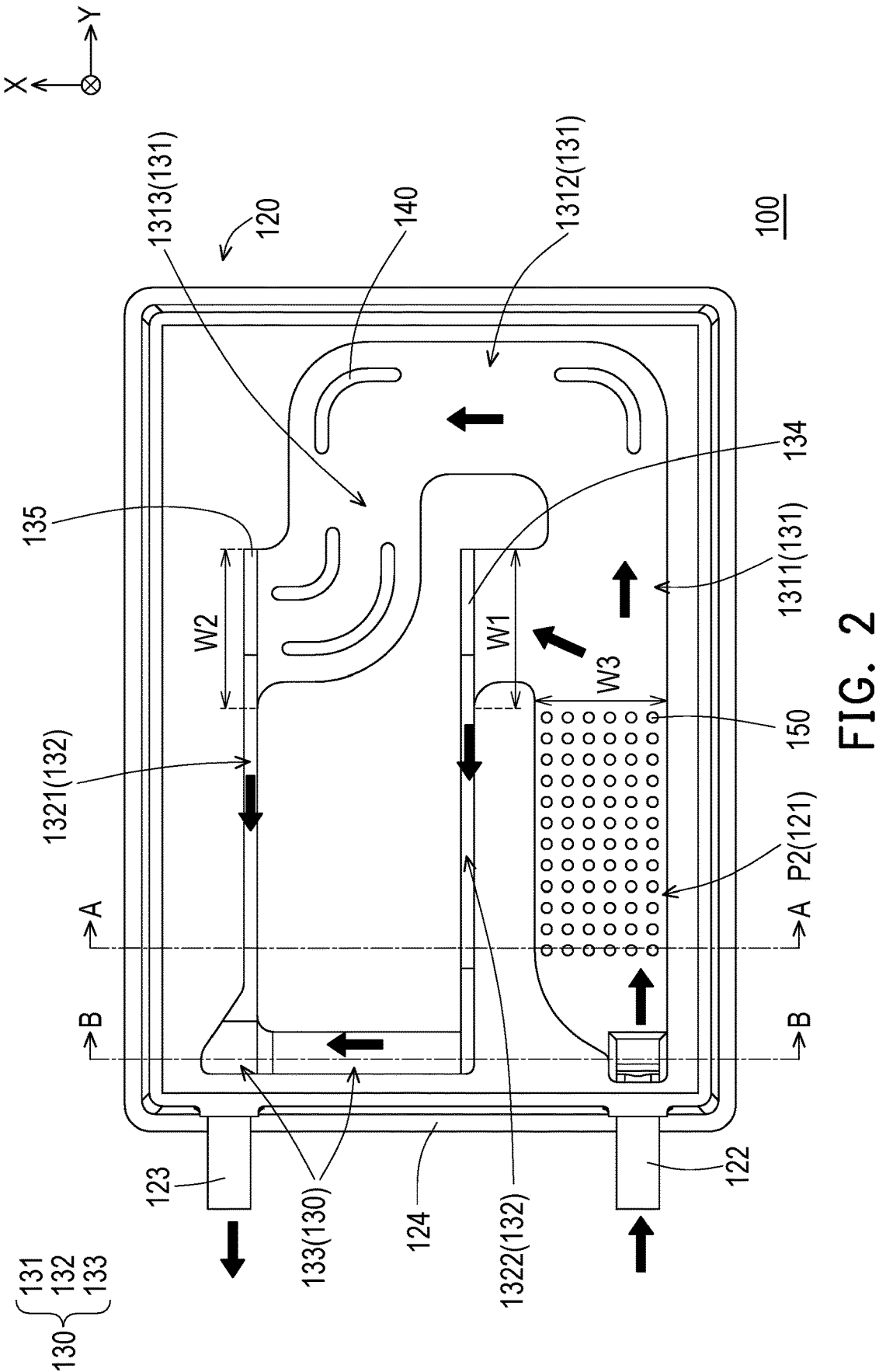
FIG. 2 is a schematic bottom view of the vehicle charging device of FIG. 1A.

FIG. 2 is a schematic bottom view of the vehicle charging device of FIG. 1A. To clearly show the flow channel structure, the cover body 110 is not presented in FIG. 2. In addition, the flow directions of the cooling fluid are denoted by bold arrows in FIG. 2. Please refer to FIG. 2, the cooling fluid in the embodiment may flow into the housing 120 from the inlet end 122, through the first channel 131, the second channel 132 and the communicating space 133 in sequence, and finally flow out of the housing 120 from the outlet end 123.

In detail, the first channel 131 includes a first region 1311, a second region 1312 and a third region 1313. The first region 1311 is connected between the inlet end 122 and the second region 1312 and is nearly perpendicular to the sidewall 124. The second region 1312 is connected between the first region 1311 and the third region 1313 and is parallel to the sidewall 124. The flow channel structure 130 also includes a first gate 134 and a second gate 135. The first region 1311 communicates with the second channel 1322 through the first gate 134, and the third region 1313 communicates with the second channel 1321 through the second gate 135.

When the cooling fluid flows into the housing 120 from the inlet end 122, the cooling fluid passes through the first region 1311 and forms a first separate flow and a second separate flow. The first separate flow enters the second region 1312 and the third region 1313 in sequence, then passes through the second gate 135 and enters the second channel 1321 along a direction (roughly the Z-axis direction) vertical to the plane where the first channel 131 is located. Then, this separate flow in the second channel 1321 moves along a direction (roughly the negative Y-axis direction) nearly perpendicular to the sidewall 124 and enters the communicating space 133, then moves along a direction (the X-axis direction) parallel to the sidewall 124, and finally enters the outlet end 123 from the communicating space 133 and flows out of the housing 120.

On the other hand, the second separate flow of the first region 1311 passes through the first gate 134 and enters the second channel 1322 along a direction (roughly the Z-axis direction) vertical to the plane where the first channel 131 is located. Then, this separate flow in the second channel 1322 moves along a direction (roughly the negative Y-axis direction) nearly perpendicular to the sidewall 124 and enters the communicating space 133, then moves in the communicating space 133 along a direction (the X direction) parallel to the sidewall 124, and finally enters outlet end 123 from communicating space 133 and flow out of housing 120.

It is worth mentioning that the first separate flow and the second separate flow of the cooling fluid in the embodiment merge in the communicating space 133, so that the inlet end 122 and the outlet end 123 may be located on the same side of the housing 120, which meets common design requirements of an on-board charger. In addition, while the inlet end 122 and the outlet end 123 are located on the same side of the housing 120, the separate-flow design allows the cooling fluid to flow through more regions, thereby increasing heat absorption and further improving heat dissipation of the heat dissipation structure 100.

In addition, a width W1 of the first gate 134 and a width W2 of the second gate 135 are preferably the same as a width W3 of the first channel 13, for example, 50 mm. Based upon lab test results, such dimensions effectively reduce vortices in the second channels 1321, 1322, making it easy for the cooling fluid to form a streamline flow or a developed flow, thereby improving heat transfer efficiency.

Figure 3:
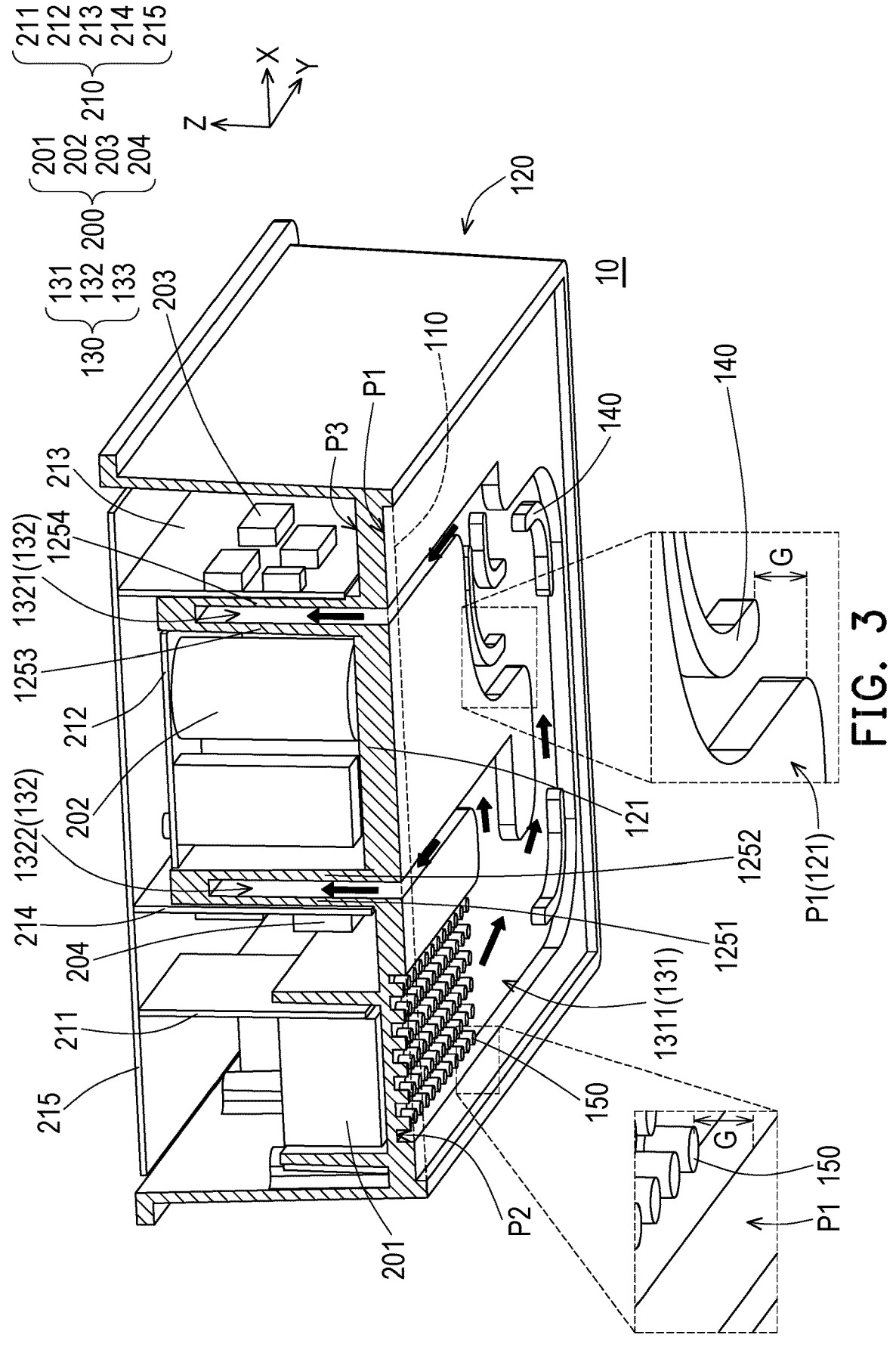
FIG. 3 is a schematic cross-sectional view of the vehicle charging device of FIG. 1A along line A-A.

FIG. 3 is a schematic cross-sectional view of the vehicle charging device of FIG. 1A along line A-A. To clearly show the flow channel structure, the cover body 110 in FIG. 3 is illustrated by dashed lines. In addition, the flow direction of the cooling fluid is denoted by bold arrows in FIG. 3. Please refer to FIG. 3, the vehicle charging device 10 further includes at least one heating element 200 and at least one board 210. The at least one heating element 200 in the embodiment includes a first heating element 201, a second heating element 202, a third heating element 203 and a fourth heating element 204, but the number of the heating element 200 is not limited thereto. The heating element 200 is disposed in the housing 120. The heating element 200 and the cover body 110 are located on different sides of the bottom wall 121. The cooling fluid may flow through first channel 131 and the second channel 1321, 1322 of the flow channel structure 130 to cool the heating element 200.

In detail, the first heating element 201 and the second heating element 202 in the embodiment are passive electronic elements, such as magnetic elements or capacitors, but the types of the passive electronic elements are not limited thereto. The third heating element 203 and the fourth heating element 204 are active electronic components, such as power semiconductors, but the types of the active electronic components are not limited thereto. In other embodiments, the first heating element 201 and the second heating element 202 may be active electronic components, while the third heating element 203 and the fourth heating element 204 may be passive electronic components, which is not limited in the invention.

The at least one board 210 in this embodiment includes a first board 211, a second board 212, a third board 213, a fourth board 214 and a main board 215, but the number of the at least one board 210 is not limited thereto. The first board 211, the second board 212, the third board 213, the fourth board 214 and the main board 215 are disposed in the housing 120. The main board 215 is, for example, a motherboard, and is connected to the first board 211, the second board 212, the third board 213 and the fourth board 214. The first board 211, the third board 213 and the fourth board 214 are, for example, nearly perpendicular to the bottom wall 121, and the second board 212 is, for example, parallel to the bottom wall 121.

The first heating element 201 is disposed on the first board 211 and contacts a third surface P3 of the bottom wall 121 relative to the first surface P1. Since the bottom wall 121 is connected to the first channel 131, the first heating element 201 may be thermally coupled to the first channel 131 through the bottom wall 121. In other words, the heat generated by the first heating element 201 may be transferred from the bottom wall 121 to the first channel 131, and then the cooling fluid in the first channel 131 passes through the second channel 132, the communicating space 133 (FIG. 2) and the outlet end 123 (FIG. 2) and discharges the heat out of the housing 120 to achieve good heat dissipation.

Similarly, the second heating element 202 is disposed on the second board 212 and contacts the third surface P3 of the bottom wall 121. The second heating element 202 is thermally coupled to the first channel 131 through the bottom wall 121. In other words, the heat generated by the second heating element 202 may be transferred from the bottom wall 121 to the first channel 131, and then the cooling fluid in the first channel 131 passes through the second channel 132, the communicating space 133 and the outlet end 123 and discharges the heat out of the housing 120.

On the other hand, the housing 120 further includes two opposite inner sidewalls 1251, 1252, and two opposite inner sidewalls 1253, 1254. The inner sidewalls 1251, 1252, 1253, 1254 are disposed nearly vertically on the bottom wall 121 and extend in a direction away from the cover body 110 (roughly Z-axis direction). The second channel 1321 is formed between the inner sidewall 1253 and the inner sidewall 1254, and the second channel 1322 is formed between the inner sidewall 1251 and the inner sidewall 1252.

The third heating element 203 and the fourth heating element 204 are respectively disposed on the third board 213 and the fourth board 214. The third board 213 is connected to the inner sidewall 1254, and the fourth board 214 is connected to the inner sidewall 1251. Since the inner side-wall 1254 is connected and proximity to the second channel 1321, the third heating element 203 may be thermally coupled to the second channel 1321 through the third board 213 and the inner sidewall 1254. Likewise, since the inner sidewall 1251 is connected to the second channel 1322, the fourth heating element 204 may be thermally coupled to the second channel 1322 through the fourth board 214 and the inner sidewall 1251. In other words, the heat generated by the third heating element 203 and the fourth heating element 204 may be transferred from the inner sidewall 1254, 1251 to the second channel 1321, 1322, respectively, and the cooling fluid in the second channels 1321, 1322 passes through the communicating space 133 and the outlet end 123 and then discharges the heat out of the housing 120 to achieve good heat dissipation.

With the design that the first channel 131 and the second channel 132 are nearly perpendicular to each other or perpendicular to each other, the heat dissipation structure 100 increases the heat dissipation region without reducing the power density of the vehicle charging device 10, thereby beneficial to product miniaturization. The heat dissipation structure 100 not only dissipates heat from the first heating element 201 and second heating element 202 disposed horizontally, but also dissipate heat from the third heating element 203 and fourth heating element 204 disposed vertically, realizing excellent performance of three-dimensional heat dissipation. In addition, the heating element 200 may be freely disposed in the first channel 131 and the second channel 132, allowing more efficient use of the space in the housing 120.

In the embodiment, a thermal interface material, such as thermal grease, potting compound or a gap filler, is provided between the heating element 200 and the board 210 or between the board 210 and the inner sidewall 1251, but the type of the thermal interface material is not limited thereto. For example, potting compound is provided between the first heating element 201 and the bottom wall 121, a gap filler is provided between the second heating element 202 and the bottom wall 121, and thermal grease is applied between the third board 213 and the inner sidewall 1254 and between the fourth board 214 and the inner sidewall 1251 as well. Therefore, the heat generated by the first heating element 201, the second heating element 202, the third heating element 203 and the fourth heating element 204 may be transferred to the first channel 131 and the second channel 132 more quickly, thereby improving the overall cooling efficiency.

In addition, the heat dissipation structure 100 in the embodiment further includes a plurality of protruding portions 150. The gap between the protruding portions 150 is, for example, 1 mm. The protruding portions 150 protrude from the second surface P2 of the bottom wall 121 of the housing 120 and is located in the first region 1311 of the first channel 131. The protruding portions 150 are, for example, a circular cylinder or a diamond-shaped cylinder, but the shape of the protruding portions 150 is not limited thereto. The protruding portion 150 increases the heat dissipation area of the bottom wall 121, so that the heat generated by the first heating element 201 may be transferred to the first channel 131 more efficiently, enhancing the heat dissipation performance of the first channel 131. The protruding portions 150 may be a part of the bottom wall 121 and formed at the same time as the bottom wall 121 is made. A distance G is formed between the protruding portions 150 and the cover body 110, wherein the distance G is, for example, 1 mm, so as to prevent the protruding portions 150 from interfering with the cover body 110 in structure.

In addition, the heat dissipation structure 100 in the embodiment further includes at least one flow guiding element 140. Four flow guiding element 140 are shown in the embodiment, but the number of the at least one flow guiding element 140 is not limited thereto. The flow guiding elements 140 are arc-shaped, disposed on the second surface P2 of the bottom wall 121 of the housing 120, and are located in the first channel 131. The flow guiding elements 140 are, for example, disposed at the corners of the first channel 131 to prevent the cooling fluid from forming vortices when it turns, helping the cooling fluid form a streamline flow or spread flow more easily, thereby improving heat transfer efficiency. In addition, a distance G is formed between the cover body 110 and the flow guiding elements 140 (that is, between the first surface P1 of the bottom wall 121 and the flow guiding elements 140). The distance G is, for example, 1 mm, so as to prevent the flow guiding elements 140 from interfering with the cover body 110 in structure and reduce the resistance that the cooling fluid may experience.

Figure 4:
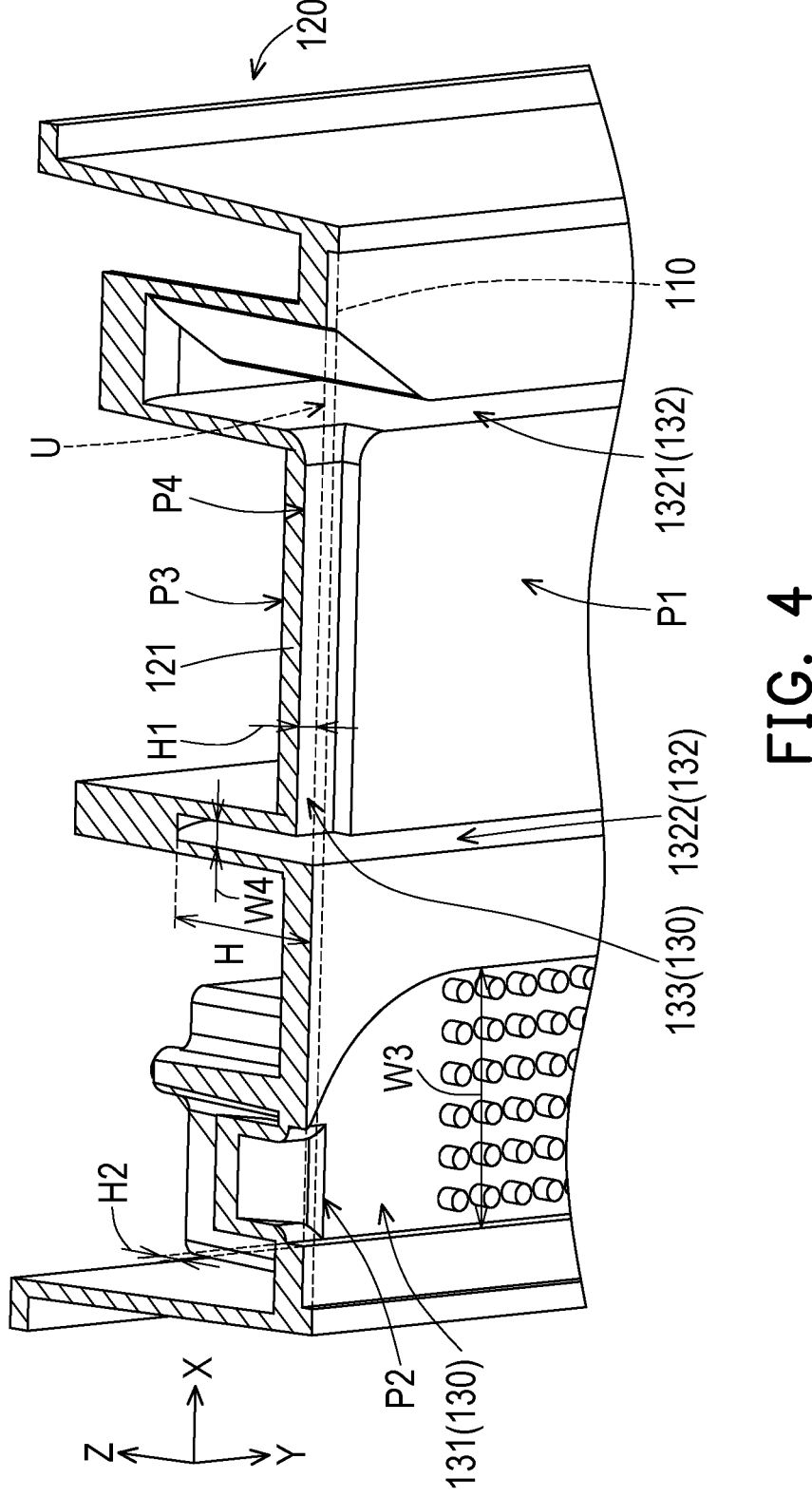
FIG. 4 is a schematic cross-sectional view of the vehicle charging device of FIG. 1A along line B-B.

FIG. 4 is a schematic cross-sectional view of the vehicle charging device of FIG. 1A along line B-B. To clearly show the heat dissipation structure, the board and heating element are not presented in FIG. 4, and the cover body 110 is illustrated by dashed lines. Please refer to FIG. 4, the communicating space 133 communicates the second chan-nels 1321 and 1322, and the cooling fluid in the second channels 1321 and 1322 merges in the communicating space 133 and then exits the housing 120 through the outlet end 123 (FIG. 2).

A depth H1 of the communicating space 133 in a direction (the Z-axis direction) perpendicular to the bottom wall 121 is greater than a depth H2 of the first channel 131 in the direction. In detail, the bottom wall 121 further includes a fourth surface P4 opposite to the third surface P3. The fourth surface P4 is recessed from the first surface P1. The fourth surface P4, the first surface P1 and the second surface P2 are located on the same side of the bottom wall 121. The depth H1 is formed between the fourth surface P4 of the bottom wall 121 and the upper surface U of the cover body 110, and the depth H2 is formed between the second surface P2 of the bottom wall 121 and the upper surface U of the cover body 110. The depth H1 is greater than the depth H2 and achieve good flow field efficiency.

It should be noted that a width W4 of the second channels 1321, 1322 is preferably between 4 mm and 5 mm, and a height H of the second channels 1321, 1322 is preferably between 40 mm and 60 mm. Based upon lab test results, such dimensions ensure the cooling fluid to be filled in the space of the second channels 1321, 1322 under appropriate hydraulic pressure, so that the cooling fluid does not fall due to gravity, which may affect the cooling effect of the second channels 1321, 1322.

In addition, the width W3 of the first channel 131 is preferably 50 mm, and the depth H2 of the first channel 131 is preferably 5 mm. Based upon lab test results, such dimensions effectively reduce the hydraulic pressure drop of the cooling fluid and the possibility of vortices, thereby helping the cooling fluid form a streamlined flow more easily and improving the overall heat transfer efficiency.

Figure 5:
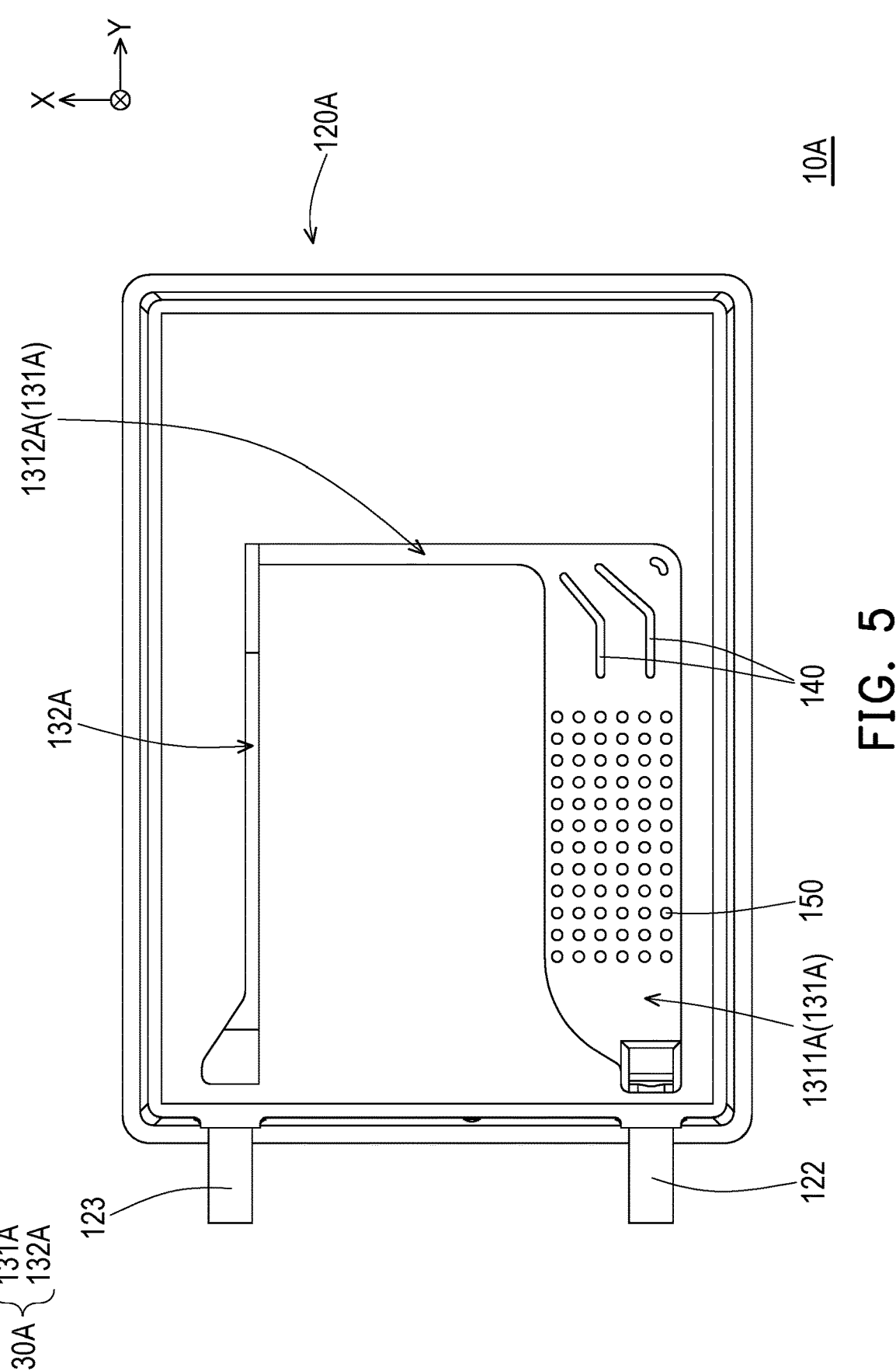
FIG. 5 is a schematic bottom view of a vehicle charging device according to another embodiment of the invention.

FIG. 5 is a schematic bottom view of a vehicle charging device according to another embodiment of the invention. To clearly show the flow channel structure, the cover body is not presented in FIG. 5. The main differences between the vehicle charging device 10A in FIG. 5 and the vehicle charging device 10 in FIG. 2 are that there is only one second channel 132A of the flow channel structure 130A in FIG. 5, and the flow channel structure 130A has no communicating space. Specifically, the first channel 131A includes a first region 1311A and a second region 1312A connected to each other. The first region 1311A communicates the inlet end 122 and the second region 1312A, and the second region 1312A communicates the first region 1311A and the second channel 132A. The second region 1312A and the second channel 132A are disposed in an L shape. The second channel 132A is directly connected to the outlet end 123. The cooling fluid passes through inlet end 122, the first region 1311A, the second region 1312A and the second channel 132A in sequence, and flows out of the housing 120A through the outlet end 123 to discharge heat from the housing 120A.

Figure 6:
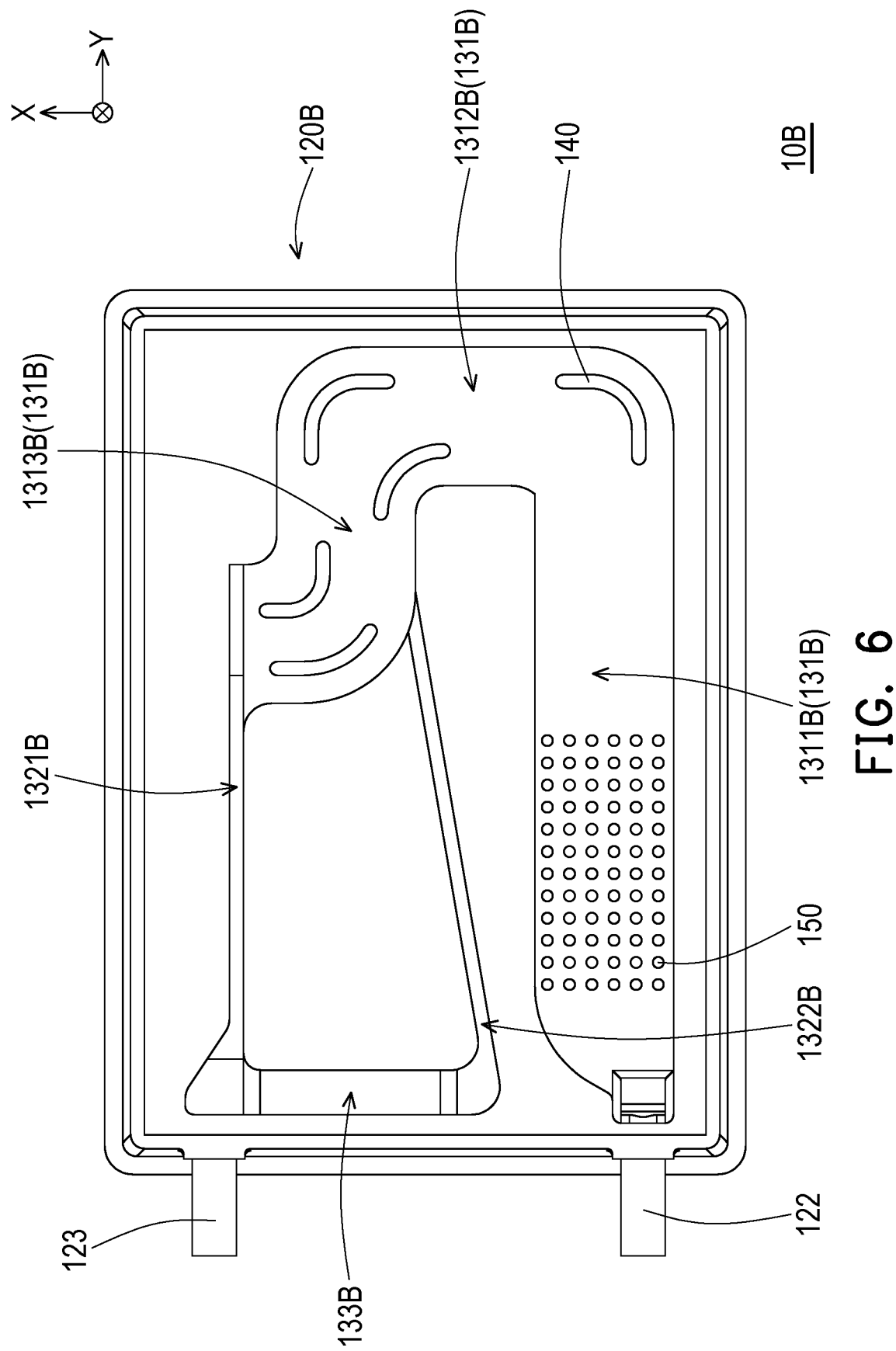
FIG. 6 is a schematic bottom view of a vehicle charging device according to another embodiment of the invention.

FIG. 6 is a schematic bottom view of a vehicle charging device according to another embodiment of the invention. To clearly show the flow channel structure, the cover body is not presented in FIG. 6. A main difference between the vehicle charging device 10B in FIG. 6 and the vehicle charging device 10 in FIG. 2 is that the second channels 1321B, 1322B in FIG. 6 are not parallel to each other. Specifically, the first channel 131B includes a first region 1311B, a second region 1312B and a third region 1313B. The first region 1311B communicates the inlet end 122 and the second region 1312B, the second region 1312B communicates the first region 1311B and the third region 1313B, and the third region 1313B communicates the second channels 1321B, 1322B. The cooling fluid passes through the first region 1311B and the second region 1312B sequentially from the inlet end 122, and then flows into the second channels 1321B, 1322B from the third region 1313B. The cooling fluid flowing in the second channels 1321B, 1322B merges in the communicating space 133B and flows out of the housing 120B through the outlet end 123 to discharge the heat from the housing 120B.

In summary, in the heat dissipation structure of the invention, when the cooling fluid flows into the flow channel structure, the vehicle charging device may be cooled by the first channel and the second channel. Since the second channel rises from the first channel vertically, the first channel and the second channel are located on different planes, thereby increasing the cooling area without reducing the power density of the vehicle charging device, which is beneficial for product miniaturization. Meanwhile, the heating element may be freely disposed on the first channel or the second channel, making the use of space in the housing more flexible. More importantly, through the combination of the first channel and the second channel which are perpendicular or nearly perpendicular to each other, the invention realizes liquid cooling in a three-dimensional space and effectively improves heat dissipation.

In addition, the dimensions of the second channel ensure the cooling fluid to be filled in the entire space in the second channel, so that the cooling fluid will not fall due to gravity and affect heat dissipation. Moreover, the heat dissipation structure further includes flow guiding elements that prevent the cooling fluid from forming vortices when turning, making it easier for the cooling fluid to form a streamline flow and thus improving the heat transfer efficiency of the device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A heat dissipation structure, for cooling a vehicle charging device, comprising:
   a cover body;
   a housing, comprising a bottom wall, an inlet end and an outlet end, wherein the cover body is hermetically sealed to the bottom wall of the housing, and the inlet end and the outlet end are respectively disposed on at least one sidewall of the housing; and
   a flow channel structure, disposed in the housing and comprising a first channel and at least one second channel communicating with the first channel,
   wherein the inlet end communicates with the first channel, the outlet end communicates with the at least one second channel, the first channel is formed between the bottom wall of the housing and the cover body, and the at least one second channel rises from the first channel,
   wherein the flow channel structure further includes a communicating space, the at least one second channel includes two second channels, and the communicating space is directly connected to all of the two second channels and the outlet end.

2. The heat dissipation structure according to claim 1, wherein a cooling fluid is adapted to flow into the housing from the inlet end, pass through the first channel and the at least one second channel in sequence, and flow out of the housing from the outlet end.

3. The heat dissipation structure according to claim 1, wherein the housing further comprises at least two inner sidewalls opposite to each other, the at least two inner sidewalls are disposed nearly vertically on the bottom wall, and the at least one second channel is formed between the at least two inner sidewalls.

4. The heat dissipation structure according to claim 1, wherein a depth of the communicating space in a direction perpendicular to the bottom wall is greater than a depth of the first channel in the direction.

5. The heat dissipation structure according to claim 1, further comprising at least one flow guiding element, wherein the at least one flow guiding element is arc-shaped, disposed on the bottom wall of the housing and located in the first channel.

6. The heat dissipation structure according to claim 5, wherein a gap is formed between the cover body and the at least one flow guiding element.

7. The heat dissipation structure according to claim 1, further comprising a plurality of protruding portions, wherein the protruding portions protrude from the bottom wall of the housing and are located in the first channel.

8. The heat dissipation structure according to claim 1, wherein the inlet end and the outlet end are located on the same side of the housing.

9. The heat dissipation structure according to claim 1, wherein a width of the at least one second channel is between 4 mm and 5 mm, and a height of the at least one second channel is between 40 mm and 60 mm.

10. A vehicle charging device, comprising:

a heat dissipation structure, comprising:

a cover body;

a housing, comprising a bottom wall, an inlet end and an outlet end, wherein the cover body is hermetically sealed to the bottom wall of the housing, and the inlet end and the outlet end are respectively disposed on at least one sidewall of the housing; and a flow channel structure, disposed in the housing and comprising a first channel and at least one second channel communicating with each other, wherein the inlet end communicates with the first channel, the outlet end communicates with the at least one second channel, the first channel is formed between the bottom wall of the housing and the cover body, and the at least one second channel rises from the first channel; and at least one heating element, disposed in the housing, wherein a cooling fluid is adapted to flow through the flow channel structure to dissipate heat from the at least one heating element, wherein the flow channel structure further includes a communicating space, the at least one second channel includes two second channels, the communicating space communicates the two second channels and the outlet end, and the first channel is directly connected to both of the two second channels.

11. The vehicle charging device according to claim 10, wherein the cooling fluid is adapted to flow into the housing from the inlet end, pass through the first channel and the at least one second channel in sequence, and flow out of the housing from the outlet end.

12. The vehicle charging device according to claim 10, further comprising an inner sidewall and a board nearly perpendicular to the bottom wall, wherein the at least one heating element is an active electronic component and is configured on the board, the board is connected to the inner sidewall, the inner sidewall is disposed nearly vertically on the bottom wall, and the at least one heating element is thermally coupled to the at least one second channel through the board and the inner sidewall.

13. The vehicle charging device according to claim 10, further comprising a board parallel to or nearly perpendicular to the bottom wall, wherein the at least one heating element is a passive electronic component configured on the board, the board is disposed in the housing, the at least one heating element contacts the bottom wall and is thermally coupled to the first channel.

14. The vehicle charging device according to claim 10, wherein the housing further comprises at least two inner sidewalls opposite to each other, the at least two inner sidewalls are disposed nearly vertically on the bottom wall, and the at least one second channel is formed between the at least two inner sidewalls.

15. The vehicle charging device according to claim 10, wherein a depth of the communicating space in a direction perpendicular to the bottom wall is greater than a depth of the first channel in the direction.

16. The vehicle charging device according to claim 10, further comprising at least one flow guiding element, wherein the at least one flow guiding element is arc-shaped, disposed on the bottom wall of the housing and located in the first channel.

17. The vehicle charging device according to claim 16, wherein a gap is formed between the cover body and the at least one flow guiding element.

18. The vehicle charging device according to claim 10, further comprising a plurality of protruding portions, wherein the protruding portions protrude from the bottom wall of the housing and are located in the first channel.

19. The vehicle charging device according to claim 10, wherein the inlet end and the outlet end are located on the same side of the housing.

20. The vehicle charging device according to claim 10, wherein a width of the at least one second channel is between 4 mm and 5 mm, and a height of the at least one second channel is between 40 mm and 60 mm.

\* \* \* \* \*